United States Patent [19]

Dreibelbis et al.

[11] Patent Number: 4,730,122
[45] Date of Patent: Mar. 8, 1988

[54] POWER SUPPLY ADAPTER SYSTEMS

[75] Inventors: Jeffrey H. Dreibelbis, Williston; Roy C. Flaker, Essex Junction; Erik L. Hedberg, Essex Center, all of Vt.

[73] Assignee: International Business Machines Corporation, Armonk, N.Y.

[21] Appl. No.: 908,846

[22] Filed: Sep. 18, 1986

[51] Int. Cl.[4] .................................................. H02J 3/04
[52] U.S. Cl. ........................................ 307/75; 307/130; 363/62; 361/86
[58] Field of Search .......... 307/252 J, 252 M, 296 R, 307/296 A, 297, 475, 264, 562, 451, 363, 75, 60, 125, 130, 149, 150, 151, 205; 361/86, 88, 90, 91, 92, 93, 100, 101; 323/299, 303, 300; 363/18, 21, 101, 61, 60, 140, 141, 142, 143

[56] References Cited

U.S. PATENT DOCUMENTS

| | | | |
|---|---|---|---|
| 3,076,135 | 1/1963 | Farnsworth et al | 323/22 |
| 3,737,758 | 6/1973 | Allington | 363/60 X |
| 3,879,648 | 4/1975 | Hoffman | 363/62 |
| 4,167,777 | 9/1979 | Allington | 363/61 |
| 4,195,333 | 3/1980 | Hedel | 363/79 X |
| 4,205,369 | 5/1980 | Asano | 363/62 |
| 4,309,627 | 1/1982 | Tabata | 307/362 |
| 4,315,208 | 2/1982 | McElroy et al. | 363/101 X |
| 4,428,040 | 1/1984 | Yamashiro et al. | 363/62 |
| 4,433,282 | 2/1984 | Squires | 363/62 X |
| 4,446,499 | 5/1984 | Kishimoto et al. | 361/92 |
| 4,463,270 | 1/1984 | Gordon | 307/296 |
| 4,469,959 | 9/1984 | Luke et al. | 307/264 |
| 4,536,699 | 8/1985 | Baker | 361/85 X |
| 4,538,198 | 8/1985 | Imanishi et al. | 361/86 |
| 4,543,494 | 9/1985 | Wakimoto | 361/86 X |
| 4,553,196 | 11/1985 | Tokuyama et al. | 363/61 X |
| 4,595,873 | 6/1986 | Musil | 363/21 X |
| 4,654,538 | 3/1987 | Lethellier | 307/130 X |
| 4,665,323 | 5/1987 | Russell et al. | 363/143 X |
| 4,669,039 | 5/1987 | Brakus | 363/21 X |

OTHER PUBLICATIONS

Furuyama, Tohru, et al., "An Experimental 4Mb CMOS DRAM", ISSCC Digest of Technical Papers, pp. 272-273, Feb. 1986.

Primary Examiner—William M. Shoop, Jr.
Assistant Examiner—Paul Ip
Attorney, Agent, or Firm—Stephen J. Limanek

[57] ABSTRACT

A power supply adapter system is provided which includes a voltage supply source terminal, an output terminal, first and second switches, the first switch being disposed between the voltage supply source terminal and the output terminal, voltage conversion means serially connected with the second switch and disposed between the voltage supply source terminal and a point of reference potential and having an output coupled to the output terminal, and means for detecting first and second ranges of voltages at the power supply source terminal and for producing first and second control voltages, respectively, to control the first and second switches.

25 Claims, 2 Drawing Figures

POWER SUPPLY ADAPTER SYSTEMS

TECHNICAL FIELD

This invention relates to power or voltage supply systems and, more particularly, to a power or voltage supply system which provides an output voltage of a given magnitude from a first supply source having a voltage of the given magnitude and alternatively from a second supply source having a voltage of a magnitude significantly different from that of the given magnitude.

BACKGROUND ART

Reduced scaling or shrinking of the geometries of devices used in integrated semiconductor circuit technology for forming denser circuits has required voltage supply sources to provide lower voltages than the heretofore generally accepted standard supply voltage of 5 volts, particularly in order to avoid a voltage breakdown in the insulation layers. During the transition from 5 volt supplies to the lower voltage supplies of, say, 3.3 volts, a mix of circuits is being used wherein some of the circuits have been designed for use with standard 5 volt supplies while other circuits have been designed for use with the lower 3.3 volt supplies. In general, the geometries of memory circuits are reduced at a faster rate than are the geometries of logic circuits which are coupled to the memory circuits. Accordingly, a voltage mismatch results during this transition period when multiple levels of power supplies coexist in a given system.

In U.S. Pat. No. 4,469,959, filed by K. Luke et al on Mar. 15, 1982, there is disclosed a circuit for controlling the supply voltage to a complementary metal oxide semiconductor (CMOS) inverter circuit which uses first and second voltage sources wherein a voltage magnitude variation in the first supply source causes the second supply source to be connected to the inverter circuit.

U.S. Pat. No. 3,076,135, filed by R. P. Farnsworth et al on Sept. 29, 1958, discloses a transistor power supply system which turns off under an overload condition and turns on upon the removal of the overload.

U.S. Pat. No. 4,309,627, filed by J. Tabata on Mar. 27, 1979, discloses a detecting circuit for a power source voltage which includes a reference voltage generating circuit, a voltage dividing circuit and a voltage comparing circuit.

U.S. Pat. No. 4,463,270, filed by J. S. Gordon on July 24, 1980, discloses a comparator circuit for detecting a difference in relative magnitudes of two voltages which is suitable for controlling a battery backup power supply.

DISCLOSURE OF THE INVENTION

It is an object of this invention to provide a simple, low leakage power supply adapter system having an output voltage of a given magnitude regardless of whether the magnitude of the input voltage is at the given magnitude or higher than the given magnitude.

In accordance with the teachings of this invention, a power supply adapter system is provided which includes a voltage supply source terminal, an output terminal, switching means coupled to the voltage supply source and including first and second switches, the first switch being disposed between the voltage supply source terminal and the output terminal, voltage conversion means serially connected with the second switch and disposed between the voltage supply source terminal and a point of reference potential, such as ground, and having an output coupled to the output terminal, and means for detecting first and second ranges of voltages at the power supply source terminal and for producing first and second control voltages, respectively, the first control voltage being applied to the first switch and the second control voltage being applied to the second switch.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
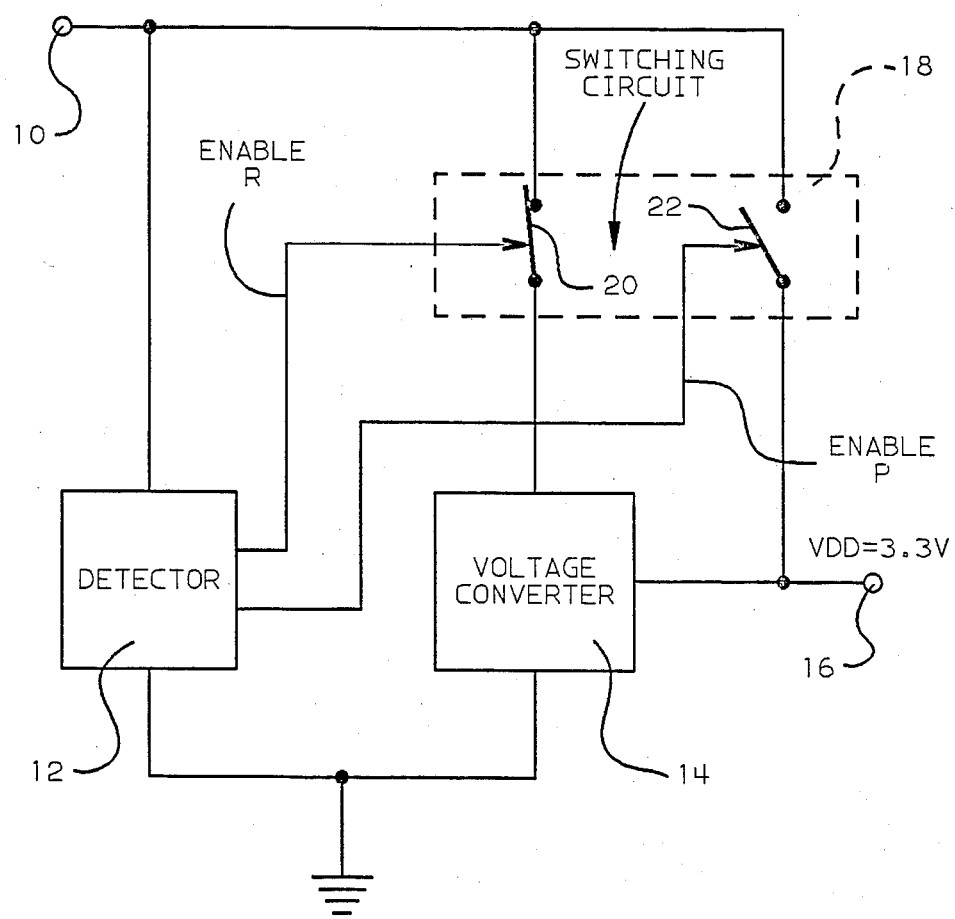
FIG. 1 illustrates primarily in block form the power supply adapter system of the present invention.

Referring to the drawings in more detail, there is illustrated primarily in block form in FIG. 1 the power supply adapter system of the present invention which includes a power supply source terminal 10 and a detector 12, which may be any standard voltage detector, connected between the power supply source terminal 10 and a point of reference potential, such as ground. The power supply adapter system also includes a voltage converter 14 having an output connected to an output terminal 16. The voltage converter 14 is designed to produce a constant output voltage VDD, when activated, having a magnitude lower than the voltage at the power supply source terminal 10. A switching circuit 18 includes a first switch 20 connected between the power supply voltage source terminal 10 and the voltage converter 14 and a second switch 22 disposed between the power supply source terminal 10 and the output terminal 16. The detector 12 is designed to produce a first control voltage indicative of a first range of voltages at the power supply source terminal 10 and a second control voltage indicative of a second range of voltages at the power supply source terminal 10. The first control voltage from the detector 12 is applied to a conductive line ENABLE R connected between a first output of the detector 12 and the first switch 20 of the switching circuit 18 and the second control voltage from the detector 12 is applied to a conductive line ENABLE P connected between a second output of the detector 12 and the second switch 22 of the switching circuit 18.

In the operation of the system of the present invention illustrated in FIG. 1 of the drawings, when the magnitude of the voltage at the power supply source terminal 10 exceeds a given voltage, e.g., 4.2 volts, as may be provided from a nominal 5 volt power supply source, the detector 12 produces the first control voltage on ENABLE R line which closes the first switch 20 of the switching circuit 18. With the first switch 20 closed, the voltage converter 14 is activated to produce at the output terminal 16 the voltage VDD having a desired magnitude of, e.g., 3.3 volts. If the voltage at the power supply source terminal 10 is lower than the given voltage, the detector 12 produces the second control voltage on ENABLE P line which closes the second switch 22 of the switching circuit 18, with the first control voltage opening the first switch 20. With the second switch 22 closed, the low voltage, i.e., the 3.3 volts, at the power supply source terminal 10 is directly applied to the output terminal 16, while the voltage converter 14 is rendered inoperative by the opening of the first switch 20. Thus, a relatively low and constant output voltage VDD of, say, 3.3 volts, is made available at the output terminal 16 regardless of whether a +5 volt power supply VH or a +3.3 volt power supply VH is connected to the power supply source terminal 10. Accordingly, the adapter circuit of the present invention permits a 3.3 volt supply technology to be powered by either a 5 volt or a 3.3 volt supply.

Figure 2:
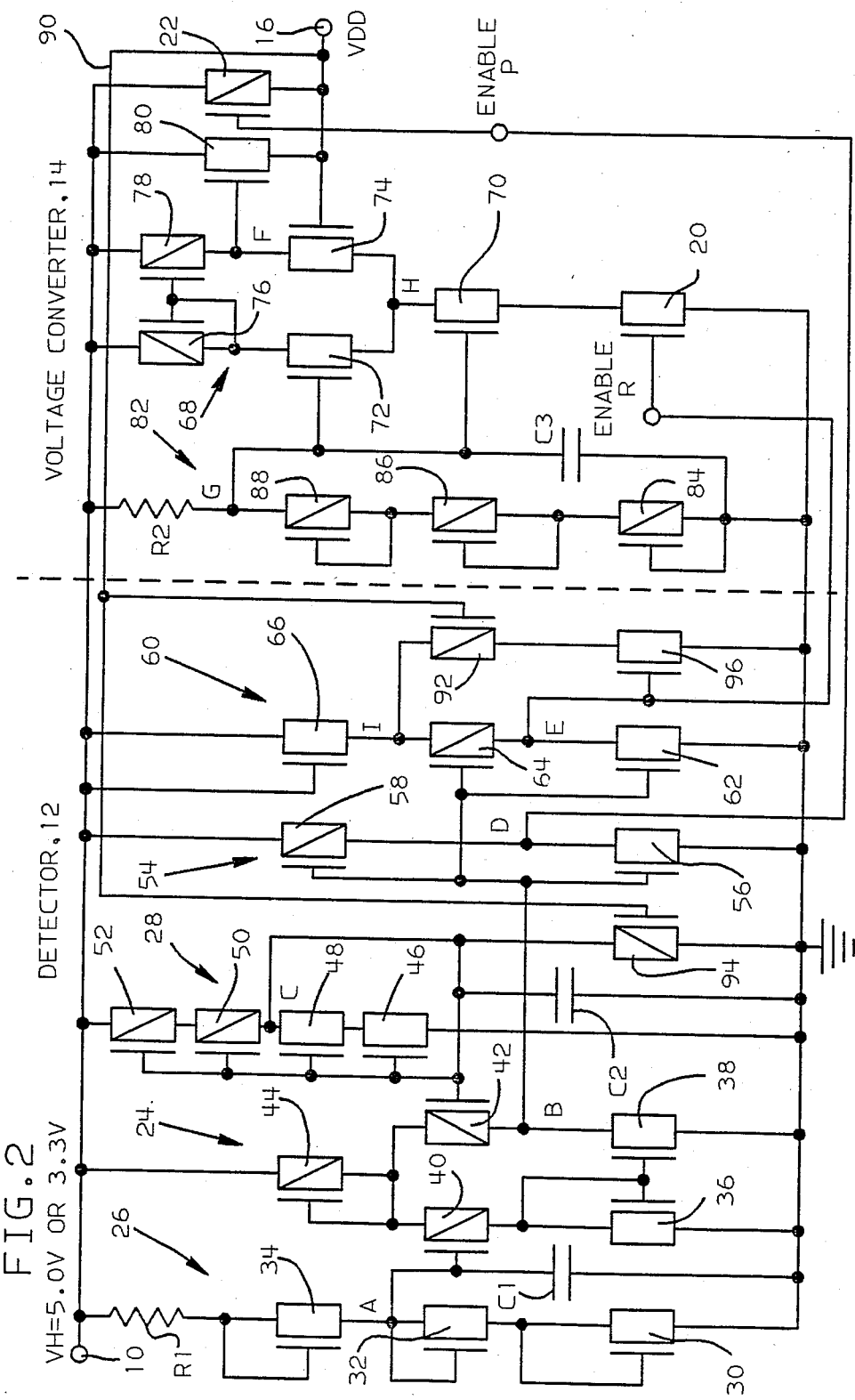
FIG. 2 is a circuit diagram of a preferred embodiment of the system of the present invention.

In FIG. 2 of the drawings, there is shown a circuit diagram of a preferred embodiment of the system of the present invention. The circuit of FIG. 2 is made in the CMOS technology with P-channel field effect transistors being indicated by a rectangle with a diagonal line formed therein and a gate electrode and with N-channel field effect transistors being indicated by a rectangle without a diagonal line and a gate electrode. Furthermore, elements in the circuit of FIG. 2 which are similar to the elements of the system of FIG. 1 are identified by the same characters. The circuit of the present invention illustrated in FIG. 2 includes the detector 12 having a first comparator circuit or differential amplifier 24, a first bias network 26 for providing a substantially constant reference voltage and a control voltage circuit 28 for providing a voltage which linearly varies with the voltage at the power supply source terminal 10. The first bias network 26 includes N-channel field effect transistors 30, 32 and 34 serially arranged with a first resistor R1, preferably having a resistance of more than one megaohm and formed in an N-well in CMOS technology, connected between the power supply source terminal 10 and a point of reference potential, such as ground. Each of the transistors 30, 32 and 34 are arranged as diodes. The first comparative circuit 24 is disposed between the power supply source terminal 10 and a point of reference potential and includes bleeder devices 36 and 38, preferably made as N-channel field effect transistors, and control devices 40 and 42 and a load device 44, preferably made as P-channel field effect transistors. The control voltage circuit 28 includes an output terminal or node C having a plurality of N-channel field effect transistors, such as transistors 46 and 48 connected between node C and a point of reference potential and a plurality of P-channel field effect transistors, such as transistors 50 and 52, connected between the node C and the power supply source terminal 10. The control gates of each of the transistors 46, 48, 50 and 52 are connected to node C. It should be understood that many more serially arranged N-channel and P-channel transistors can be used in the control voltage circuit 28, if desired. A first low-pass filter capacitor C1 is connected between the output or node A of the bias network 26 and a point of reference potential and a second low-pass filter capacitor C2 is connected between node C of the control voltage circuit 28 and a point of reference potential. The detector 12 further comprises a buffer or inverter circuit 54 which includes N-channel field effect transistor 56 and P-channel field effect transistor 58. The input to the buffer circuit 54 is connected to the output terminal or node B of the first comparative circuit 24. Node D of the buffer circuit 54 is connected to an Enable P line which is also connected to the control gate of the second switch 22, preferably a P-channel field effect transistor, connected between the power supply source terminal 10 and the output terminal 16. An interface circuit 60 designed to match the characteristics of the second switch 20, which is preferably an N-channel field effect transistor, includes serially arranged transistors 62, 64 and 66, with transistors 62 and 66 being of the N-channel type and transistor 64 being of the P-channel type. Transistors 62 and 64 form an inverter and transistor 66 is arranged as a diode. An output terminal or node E provided between transistors 62 and 64 is connected to the Enable R line which is also connected to the gate electrode of the first switch 20, preferably an N-channel field effect transistor.

The voltage converter 14 includes a second comparator circuit 68 having N-channel field effect transistors 70, 72 and 74 and P-channel field effect transistors 76 and 78. The output terminal or node F of the second comparator circuit 68 is connected to a control gate of a pass device 80, preferably an N-channel field effect transistor, connected between the power supply source terminal 10 and the output terminal 16. Transistor 70 acts as a current source, transistors 72 and 74 act as control devices and transistors 76 and 78 act as current limiters for the second comparative circuit 68. The voltage converter 14 further includes a second bias network 82 for providing a constant reference voltage having an output terminal or node G. The bias network 82 includes serially arranged P-channel field effect transistors 84, 86 and 88 disposed between node G and a point of reference potential and a second resistor R2, preferably having a resistance of more than one megaohm and formed in an N-well in CMOS technology, disposed between node G and the power supply source terminal 10. Node G is connected to the control gate of the transistor 70 and to the control gate of the transistor 72. The output terminal 16 is connected to the control gate of transistor 74. A third low-pass filter capacitor C3 is connected between node G of the second bias network 82 and a point of reference potential.

A conductive feedback line 90 is connected from the output terminal 16 to the control gate of a P-channel bleeder transistor 92 and to the control gate of a P-channel bleeder transistor 94. Transistor 92 is serially connected with an N-channel bleeder transistor 96 between node I of the interface circuit 60 and ground and transistor 94 is connected between node C of the control voltage circuit 28 and ground. The control gate of the transistor 96 is connected to node E of the interface circuit 60.

In the operation of the power supply adapter system of the present invention illustrated in FIG. 2 of the drawings, node A of the first bias network 26 of the detector 12 provides a substantially constant reference voltage, between 1.3 and 2.0 volts, with voltages at the power supply source terminal 10 as low as about 2 volts. This constant reference voltage is applied to the control gate of the control device 40 of the first comparator circuit or differential amplifier 24. The voltage at node C of the control voltage circuit 28 varies linearly with the voltage at the power supply source terminal 10. The detector 12 is designed so that when the voltage at terminal 10 is at 4.2 volts or higher, the voltage at B of the first comparator is low, which produces a high voltage at node D of the buffer circuit 54. This high voltage is sufficient to maintain the switch or the P-channel pass transistor 22 off. Thus, the voltage at the power supply source terminal 10 is not applied directly to the output terminal 16.

With node B at a low voltage, the P-channel transistor 64 of the interface circuit 60 is turned on while the N-channel transistor 62 is off. Thus, node E is at a high voltage, which is sufficient to turn on the first switch or N-channel transistor 20 to activate the voltage converter 14. The voltage converter 14, which operates under normal feedback principles, is designed so that a voltage at node F of the second comparator circuit 68 applied to the control gate of the N-channel transistor 80 maintains the output voltage VDD at the output terminal 16 at 3.3 volts as long as the voltage at the power supply source terminal 10 is above 4.2 volts. As the voltage VDD on the output terminal 16 varies so does the current through transistors 74 and 78. The voltage at node H, which is proportional to the current flowing through transistors 70 and 72 assists in controlling the voltage magnitude at the output terminal 16. The current path through transistors 74 and 78, the current path through transistors 72 and 76 and the voltage at node H together regulate the voltage at node F in direct response to the voltage on output terminal 16. The voltage at node F biases the control gate of the pass transistor 80 which supplies current to the output terminal 16.

When the voltage at the power supply source terminal 10 is below, say, 3.8 volts, such as when a 3.3 voltage source is connected to the power supply source terminal, the voltage at node B of the first comparator circuit or differential amplifier 24 of the detector 12 goes high turning on N-channel transistor 56 of the buffer circuit 54 to discharge the output node D of the buffer circuit 54. The voltage at node D is decreased to a point where the second switch or P-channel transistor 22 turns on hard so as to directly connect the power supply source terminal 10 to the output terminal 16. Meanwhile, since node B of the first comparator circuit 24 of the detector 12 is at a high voltage, N-channel transistor 62 of the interface circuit 60 turns on to discharge node E thereof. Discharging node E lowers the voltage at the control gate of the first switch or N-channel transistor 20 to turn off transistor 20 and, thus, render the voltage converter inoperative. The power supply adapter system of the present invention as illustrated in FIG. 2 of the drawings can provide substantially constant output voltages at output terminal 16 to magnitudes as low as 2.0 volts.

It should be noted that the detector 12 has two main functions, (1) to monitor the power supply voltage VH at terminal 10 and (2) to turn off and on the voltage converter 14. Furthermore, it can be seen that the circuit of FIG. 2 has a hysteresis of 400 millivolt, between VH=4.2 volts and VH=3.8 volts, built in to provide essential and desirable noise immunity characteristics.

Accordingly, it can be seen that a simple power supply adapter circuit has been provided which supplies an output voltage of, say, 3.3 volts regardless of whether a 5.0 volt source or a 3.3 volt source is connected to the power supply source terminal 10.

It should also be noted that by using CMOS technology to make the system of FIG. 2 of the drawings, the current leakage between the power supply source terminal 10 and ground is very low, even though some of the current paths between the terminal 10 and ground, such as the first bias network 26, do not use complementary devices. The paths which do not use complementary devices have minimal current leakage since they use very small devices and high resistivity resistors. Accordingly, the circuit of FIG. 2 of the drawings can be readily used in battery backup applications with a data retention mode in, e.g., six device static random access memory at voltages on terminal 10 down to 2 volts.

While the invention has been particularly shown and described with reference to preferred embodiments thereof, it will be understood by those skilled in the art that various changes in form and details may be made therein without departing from the spirit and scope of the invention.

What is claimed is:

1. A power supply adapter system comprising
   a voltage supply terminal,
   an output terminal,
   switching means including first and second switches,
      said first switch being disposed between said voltage supply terminal and said output terminal,
   voltage conversion means serially connected with said second switch and disposed between said voltage supply terminal and a point of reference potential, said voltage conversion means having an output coupled to said output terminal and,
   means for detecting first and second ranges of voltages at said voltage supply terminal and for producing first and second control signals, respectively, indicative of said first and second ranges of voltages, said first control signal being applied to said first switch and said second signal being applied to said second switch.

2. A power supply adapter system as set forth in claim 1 wherein said voltage conversion means includes a first comparator circuit having first and second inputs and first means connected between said voltage supply terminal and a point of reference potential for providing a substantially constant reference voltage at an output thereof, the output of said substantially constant reference voltage means being coupled to the first input of said comparator circuit and said output terminal being coupled to the second input of said comparator circuit.

3. A power supply adapter system as set forth in claim 2 wherein said voltage conversion means further includes a transistor connected between said voltage supply terminal and said output terminal, an output of said comparator circuit being connected to a control gate of said transistor.

4. A power supply adapter system as set forth in claim 3 wherein said first means includes a series circuit having a plurality of transistors, each being connected as a diode, and a resistor.

5. A power supply adapter system as set forth in claim 3 wherein said transistor is an N-channel field effect transistor and said first switch is a P-channel field effect transistor.

6. A power supply adapter system as set forth in claim 4 wherein each of said plurality of transistors is a P-channel field effect transistor.

7. A power supply adapter system as set forth in claim 1 wherein said detecting means includes a comparator circuit having first and second inputs, second means connected between said voltage supply terminal and a point of reference potential for providing a substantially constant reference voltage at an output thereof, the output of said second means being coupled to the first input of said second comparator circuit, and a control voltage circuit having an output coupled to the second input of said second comparator circuit.

8. A power supply adapter system as set forth in claim 7 wherein said second comparator circuit further includes first and second output terminals, said first and second control signals being produced on said first and second output terminals, respectively.

9. A power supply adapter system as set forth in claim 7 wherein said second means includes a series circuit having a plurality of transistors, each being connected as a diode, and a resistor and said control voltage circuit includes a series circuit having an output node connected between said voltage supply terminal and a point of reference potential, said series circuit including a P-channel field effect transistor disposed between said output node and said voltage supply terminal and an N-channel field effect transistor disposed between said output node and a point of reference potential.

10. A power supply adapter system as set forth in claim 9 wherein each transistor of said plurality of transistors is an N-channel field effect transistor.

11. A power supply adapter system comprising
a power supply source terminal having one of first or second voltages applied thereto,
an output terminal,
first and second switches, each having a control element, said first switch being connected between said power supply source terminal and said output terminal,
voltage conversion means having an output for converting said first voltage to a magnitude substantially equal to that of said second voltage, said output being connected to said output terminal and said means being serially connected with said second switch between said power supply source terminal and a point of reference potential,
means having first and second outputs for detecting said first and second voltages and for producing first and second control voltages on said first and second outputs, said first output being connected to the control element of said first switch and said second output being connected to the control element of said second switch.

12. A power supply adapter system as set forth in claim 11 wherein said first and second voltages have magnitudes such that only one of said switches is closed during any given period of time.

13. A power supply adapter system as set forth in claim 12 wherein said first switch is a P-channel field effect transistor and said second switch is a first N-channel field effect transistor.

14. A power supply adapter system as set forth in claim 13 wherein said voltage conversion means further includes a comparator circuit having an output node and a second N-channel field effect transistor having a control gate connected to said output node, said second N-channel field effect transistor being connected in a parallel with said P-channel field effect transistor.

15. A power supply adapter system comprising
a power supply source terminal,
an output terminal,
first and second switches, each having a control element, said first switch being coupled between said power supply source terminal and said output terminal,
a voltage detector having first and second outputs coupled to said power supply source terminal, said first output being coupled to the control element of said first switch and second output being coupled to the control element of said second switch and a voltage converter coupled to said power supply source terminal and having an output coupled to said output terminal, said second switch being serially connected with said voltage converter.

16. A power supply adapter system as set forth in claim 15 wherein each of said first and second switches is a transistor.

17. A power supply adapter system as set forth in claim 16 wherein said first switch is a P-channel field effect transistor and said second switch is an N-channel field effect transistor.

18. A power supply adapter system as set forth in claim 17 wherein said first and second outputs of said voltage detector have substantially similar voltages.

19. A power supply adapter system comprising
a power supply source terminal,
an output terminal,
a detector including a first comparator circuit having first and second inputs and an output, a first bias network having an output connected to the first input of said comparator and a control voltage circuit having an output connected to the second input of said comparator,
a voltage converter including a second comparator circuit having first and second inputs and an output coupled to said output terminal and a second bias network having an output connected to the first input of said second comparator circuit, the second input of said second comparator being connected to said output terminal,
a first switch having a control element coupled between said power supply source terminal and said output terminal and
a second switch having a control element serially connected with said voltage converter,
said output of said first comparator circuit being coupled to the control elements of said first and second switches.

20. A power supply adapter system as set forth in claim 19 wherein said first switch is a P-channel field effect transistor and said second switch is an N-channel field effect transistor.

21. A power supply adapter system as set forth in claim 20 further including first and second inverters, said output of said first comparator circuit being coupled to the control element of said first switch through said first inverter and being coupled to the control element of said second switch through said second inverter.

22. A power supply adapter system comprising
a power supply source terminal having a voltage applied thereto from within one of first and second ranges of voltages,
an output terminal,
switching means disposed between said power supply source terminal and said output terminal,
voltage conversion means having an output for converting a voltage within said first range of voltages to a voltage within said second range of voltages at said output, said voltage conversion means being coupled to said power supply source terminal and said output being coupled to said output terminal, or
means for detecting a voltage within the first range of voltages at said power supply source terminal during a first interval of time and activating said voltage conversion means and deactivating said switching means and for detecting a voltage within the second range of voltages at said power supply source terminal during a second interval of time and activating said switching means and deactivating said voltage conversion means.

23. A power supply adapter system as set forth in claim 22 wherein said voltage conversion means includes a first switch which is closed to activate and opened to deactivate said voltage conversion means and wherein said switching means includes a second switch which is closed to activate and opened to deactivate said switching means.

24. A power supply adapter system as set forth in claim 23 wherein said first switch is an N-channel field effect transistor having a control gate coupled to said detecting means and said second switch is a P-channel field effect transistor having a control gate coupled to said detecting means.

25. A power supply adapter system as set forth in claim 24 wherein said detecting means includes a comparator circuit having first and second inputs, bias network means for producing a substantially constant reference voltage applied to said first input and voltage control means for producing a voltage varying linearly with the voltage at said power supply source terminal applied to said second input.

* * * * *